United States Patent [19]
Delahoy

[11] Patent Number: 5,064,477
[45] Date of Patent: Nov. 12, 1991

[54] RADIANT ENERGY SENSITIVE DEVICE AND METHOD

[76] Inventor: Alan E. Delahoy, 33 Washington St., Rocky Hill, N.J. 08553

[21] Appl. No.: 464,792

[22] Filed: Jan. 16, 1990

[51] Int. Cl.[5] .................. H01L 31/06; H01L 31/18
[52] U.S. Cl. .................................. 136/256; 136/258; 357/30; 357/67; 357/71; 437/2; 437/4; 427/39
[58] Field of Search .................. 136/256, 258 AM; 357/30 J, 30 K, 30 Q, 67, 71; 437/2–5; 427/39, 74

[56] References Cited

U.S. PATENT DOCUMENTS 4,507,519 3/1985 Maruyama et al. ............... 136/258
4,873,118 10/1989 Elias et al. ............................ 427/39

OTHER PUBLICATIONS

S. Major et al., *Solar Energy Materials*, vol. 17, pp. 319–327 (1988).

*Primary Examiner*—Aaron Weisstuch
*Attorney, Agent, or Firm*—George E. Kersey

[57] ABSTRACT

A radiant energy sensitive device formed by a radiant energy transmissive conductor of tin oxide with an overlying radiant energy transmissive layer of zinc oxide, that, in turn, underlies a radiant energy sensitive layer, with the result that the combination of the two radiant energy transmissive layers improves the performance of the radiant energy sensitive structure with respect to energy passing through the radiant energy transmissive layer.

10 Claims, 4 Drawing Sheets

RADIANT ENERGY SENSITIVE DEVICE AND METHOD

BACKGROUND OF THE INVENTION

This invention relates to energy sensitive devices and more particularly to energy sensitive devices such as photovoltaic cells which are used to convert solar energy into electricity.

In commonly employed photovoltaic devices, amorphous silicon is used with a light transmissive conductor of tin oxide. This kind of transmissive conductor, while realizing reasonable performance in many cases, has made it difficult to improve the efficiency and the performance of the overall photovoltaic structure.

Accordingly, it is an object of the invention to enhance the efficiency of energy sensitive devices such as photovoltaic cells. Another object of the invention is to improve the performance of such devices beyond that associated with the use of standard, light transmissive tin oxide.

Summary of the Invention

In accomplishing the foregoing and related objects, the invention provides an energy sensitive device with an energy transmissive conductor having a surface layer modified by an oxidizing agent, and an energy sensitive structure deposited upon the modified surface layer of the energy transmissive conductor. The modification of the surface layer improves the performance of the energy sensitive structure with respect to energy passing through the conductor.

In accordance with one aspect of the invention the surface layer is a metallic oxide, which can be zinc oxide or a combination of different metallic oxides, such as a combination of a metallic oxide with zinc oxide. To increase its conductivity, the zinc oxide may be prepared in nonstoichiometric form, or it may be doped, for example, with boron, aluminum, or silicon. Zinc oxide can be prepared by any of the standard thin film deposition techniques, including reactive evaporation, magnetron sputtering, low pressure chemical vapor deposition (LPCVD) and atmospheric pressure CVD.

In accordance with another aspect of the invention the energy sensitive structure is a semiconductor, which can be formed from layers of different conductivity types. For example, the layers can have intrinsic and/or dopant induced characteristics.

The energy transmissive conductor desirably has a total thickness in the range from about 2,000 to about 20,000 Angstroms, and an energy transmissive substrate can support the energy transmissive conductor. The energy transmissive conductor can consist either of a single layer, or a combination of layers, e.g. tin oxide overcoated with zinc oxide.

In a method of fabricating an energy sensitive device in accordance with the invention, the steps include (a) forming an energy transmissive conductor; (b) exposing the energy transmissive conductor to an oxidizing agent to modify its surface; and (c) depositing an energy sensitive structure upon the modified surface of the energy transmissive conductor; so that the modification of the energy transmissive conductor improves the response of the energy sensitive stucture to entering energy.

In accordance with one aspect of the method, an oxidizing agent is included in a plasma, illustratively produced by an electrical discharge. The oxidizing agent is generally a gas and may be a minority constituent of the plasma in order to lessen any harmful effects upon the vacuum pump and its oil. In general, the plasma is formed by an oxidizing gas and an inert gas. In particular, the oxidizing gas is oxygen and the inert gas is argon.

In accordance with another aspect of the method, the energy transmissive conductor is a metallic oxide and the oxidant in the plasma modifies the surface of the metallic oxide to improve the efficiency and stability response of the energy sensitive stucture to energy entering the stucture through the oxide. In a specific case, the energy sensitive stucture is a light-responsive solar cell.

The method further includes depositing a conducting rear contact upon the energy sensitive structure, which can be amorphous silicon hydride, or silicon-carbon and silicon-germanium alloys. The oxidizing gas can be included in the plasma in ranges below and above about 30 per cent.

DESCRIPTION OF THE DRAWINGS

Other aspects of the invention will become apparent after considering several illustrative embodiments taken in conjunction with the drawings in which.

DETAILED DESCRIPTION

Figure 1:
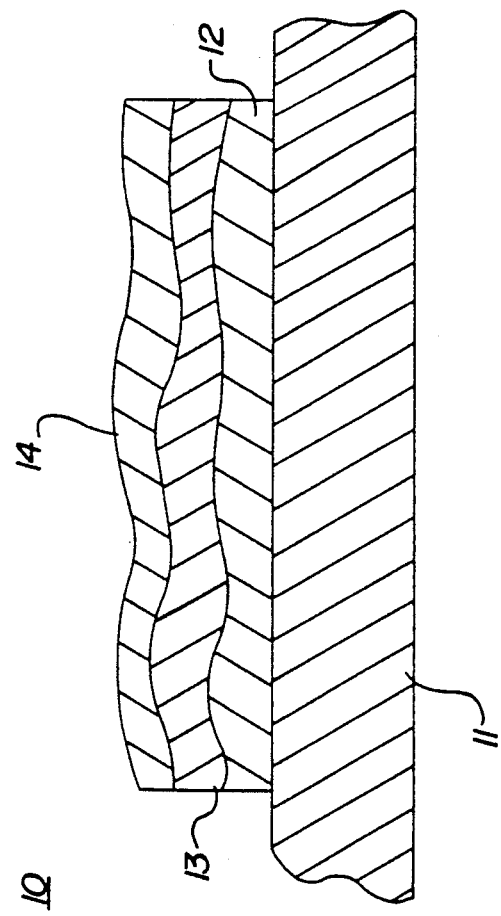
FIG. 1 is a cross-section of a photovoltaic structure employing an energy transmissive conductor.
Figure 2A:
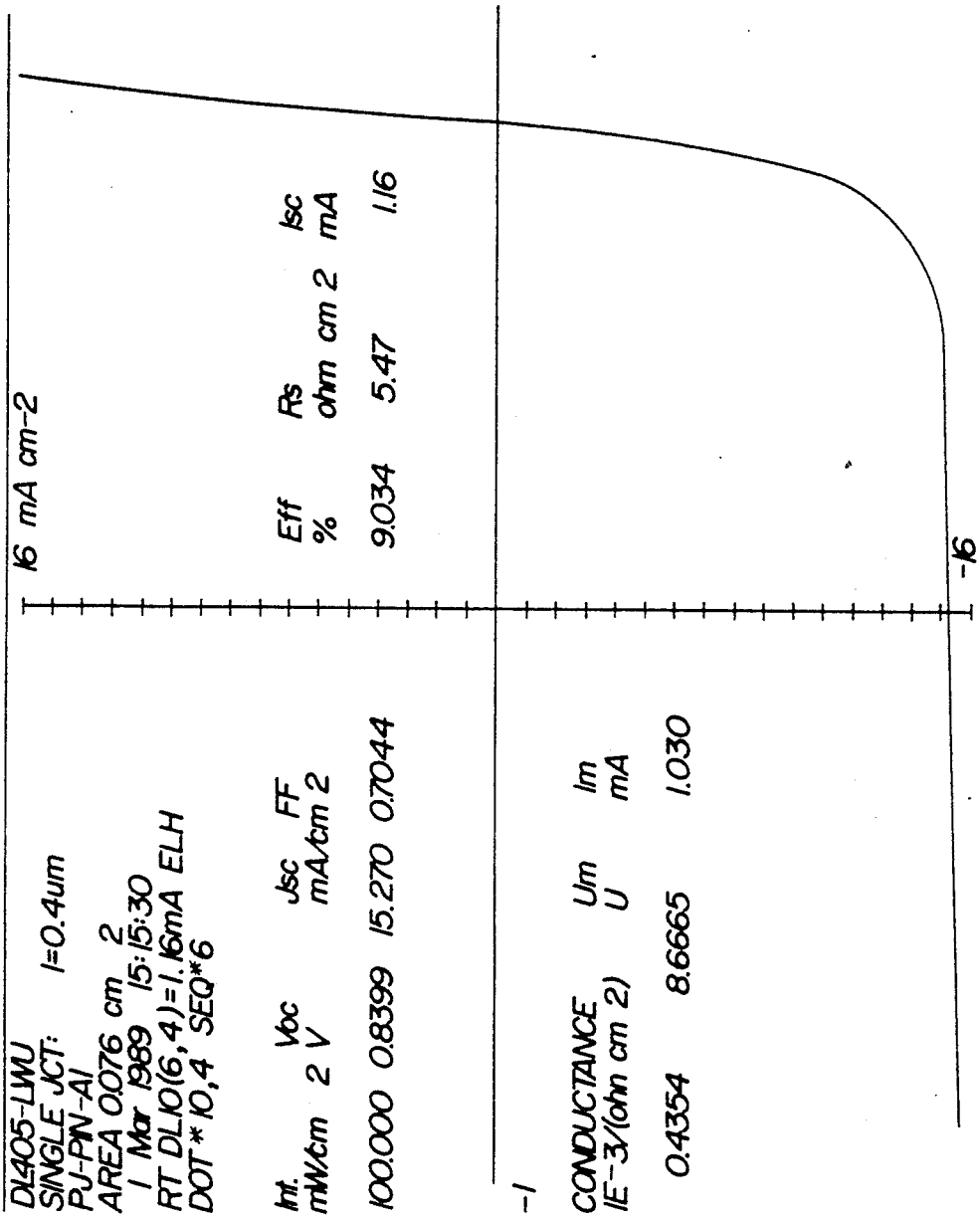
FIG. 2A is a graph of a current-voltage characteristic for a single junction photocell using a tin oxide phototransmissive conductor.
Figure 2B:
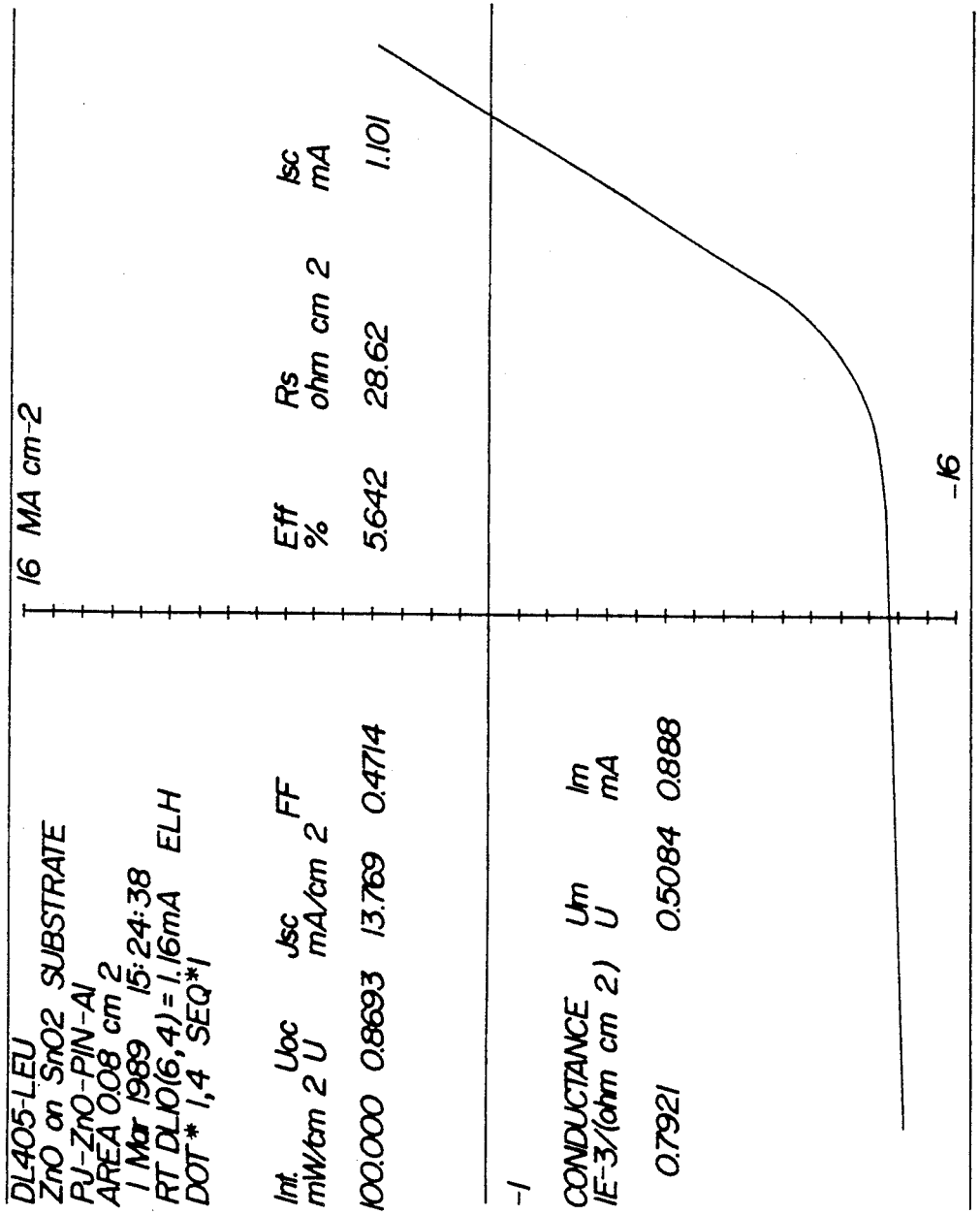
FIG. 2B is a graph of a current-voltage characteristic for a single junction photocell using a standard zinc oxide phototransmissive conductor.
Figure 3:
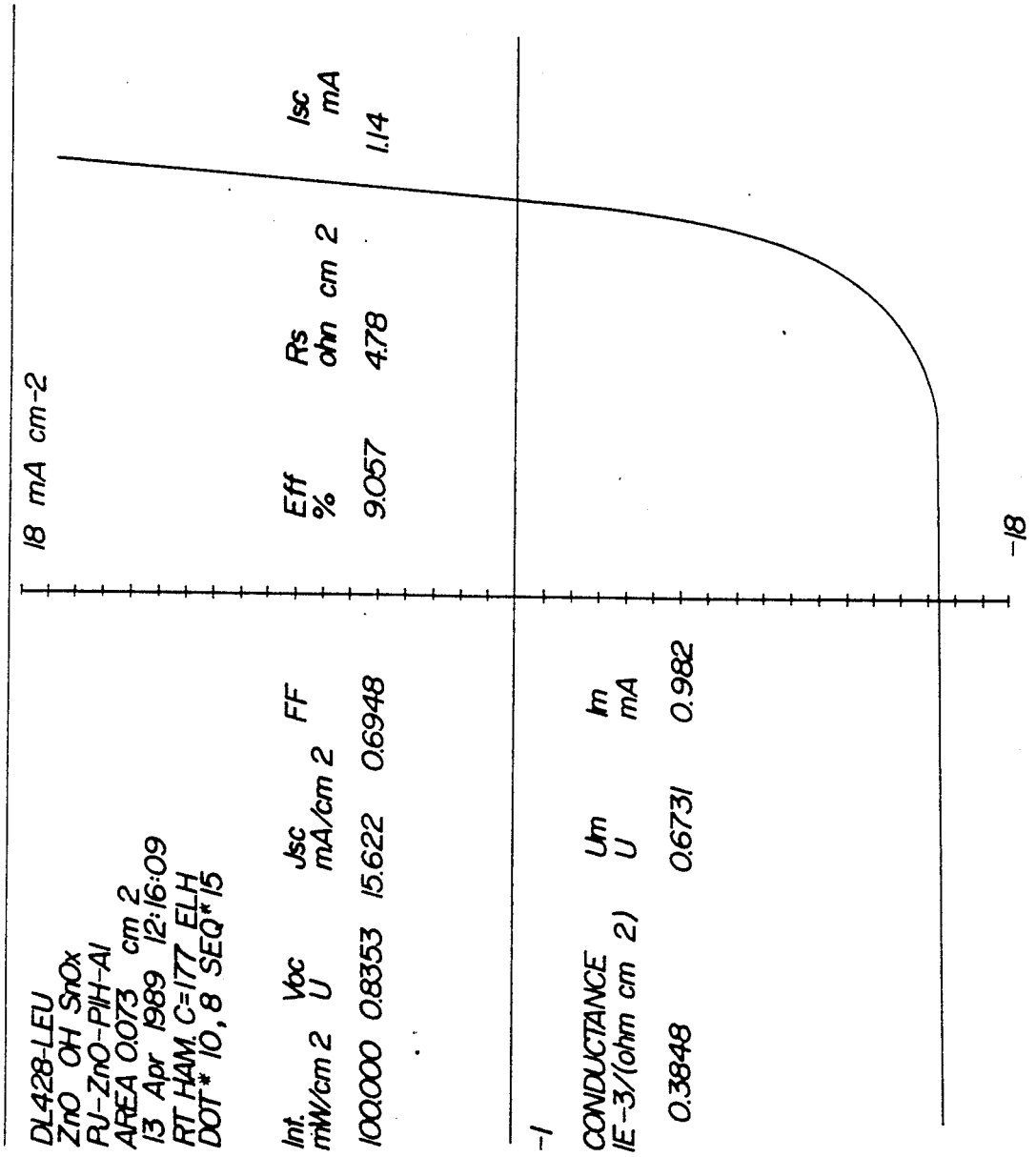
FIG. 3 is a current-voltage characteristic of a single junction cell deposited on a modified zinc oxide coated substrate in accordance with the invention.

An amorphous silicon photovoltaic device 10, such as that illustrated in FIG. 1, uses a glass substrate 11 with a conventional coating of doped tin oxide 12. Overlying the coating 12 is an amorphous silicon P-I-N structure 13 and an aluminum conductive layer 14.

An illustrative coating 12 is fluorine-doped tin oxide ($SnO_2$:F), which is a transparent conductor serving as one electrode of a photovoltaic cell.

In the structure 10 there are a number of shortcomings associated with the use of the oxide layer 12. These shortcomings include limitations in lowering the contact resistance (and thereby improving the solar cell), and in increasing the open-circuit voltage. As a result, the art has reached a state where improvements in the fill factor and open-circuit voltage of photovoltaic cells with tin oxide transparent conductors is being realized only marginally and with great difficulty.

Some attention has been given to the possible use of other materials as substitutes for tin oxide. In particular, it would be desirable to find a substitute material which would be less expensive than tin oxide and permit enhanced performance by providing an increased open-circuit voltage, a higher short-circuit current and a greater fill factor. In addition, it also would be desirable to improve the overall stability of the device.

One material that has been considered as a replacement for tin oxide is zinc oxide. Unfortunately, when zinc oxide is prepared in accordance with customary practice it performs more poorly than tin oxide. This is despite the fact that zinc oxide has a better transmission and is not subject to plasma attack during cell manufacture. The commonly used plasma method of amorphous silicon deposition chemically reduces the surface of the tin oxide, thereby producing free tin. This appears to impair the photostability of the cell and excessive free tin can also reduce initial efficiency. It also has been hoped that zinc oxide would provide better contact resistance with the adjoining semiconductor layer, and that there would be an elimination of tin contamination from the overall structure.

In the customary preparation of an amorphous silicon hydride (a-Si:H) cell on tin oxide, the contact surface of tin oxide is cleaned in situ prior to the deposition of amorphous silicon hydride by means of a plasma. A typical plasma is produced by a glow discharge in argon gas. Cells that are made without prior cleaning of the tin oxide have poor performance. Unfortunately, when the same cleaning procedure is applied to zinc oxide, there is a deterioration in performance as summarized in Table I below.

TABLE I

Comparison of a-Si:H p-i-n Solar Cell Characteristics
As a Function of Substrate Type and Plasma Treatment

| Run[1] | Substrate[2] | Plasma[3] | Voc[4] | Jsc[5] | Fill Ftr[6] | Eff[7] | Rs[8] |
|---|---|---|---|---|---|---|---|
| A | $SnO_2$ (Ctl) | Ar | 0.840 | 15.3 | 70.4 | 9.03 | 5.5 |
| A | $SnO_2$/ZnO | Ar | 0.869 | 13.8 | 47.1 | 5.64 | 28.6 |
| B | $SnO_2$/ZnO | 30% $O_2$/Ar | 0.840 | 14.4 | 73.1 | 8.87 | 4.3 |

[1] Runs were "A" (prior art) and "B" (the invention)
[2] Substrates are tin oxide and tin oxide/zinc oxide
[3] Plasma treatments were with argon and oxygen/argon
[4] Open-circuit voltage in volts
[5] Short-circuit current density in milliamps/sq-cm
[6] Fill factor in %
[7] Efficiency in %
[8] Series resistance in ohms $cm^2$ In a test arrangement, cells were prepared using a standard deposition sequence for the controlled deposition of amorphous silicon on a tin oxide contact coating and simultaneously on a zinc oxide contact coating. Both substrates were subjected to standard argon plasma cleaning. This procedure produced a laboratory efficiency of 9 percent in cells with tin oxide, but only a much reduced 5.6 percent efficiency with zinc oxide. (See results from run A in Table I).

In accordance with the invention, it has been discovered that by using a glow discharge with an oxidizing gas, efficient cells can be prepared on materials such as zinc oxide. In particular, the amount of oxidant in the plasma gas, such as argon, ranges above and below 30 percent. Other discharge parameters include temperature, gas flow rate, pressure, power and treatment time. In an illustrative embodiment the temperature was 180° C., the gas was 30% oxygen in argon and its flow was on the order of 30 sccm per minute, and the pressure was about 200 milliTorr. The radio frequency power was about 25 watts (about 14 milliwatts per square centimeter power density) and the treatment time ranged between 3 to 5 minutes.

As can be seen in Table I above, the altered procedure resulted in a cell having an 8.9 percent efficiency on a contact conductor of zinc oxide. Experiments confirm that the main effect of the oxidant in the plasma is to substantially increase the fill factor of the cell.

Surface treatment of certain transparent conductors, such as zinc oxide, in an oxidizing plasma prior to semiconductor deposition, is a necessary step for the formation of high quality photo sensitive cells. This discovery has been substantiated by numerous runs conducted by the applicants designated as 405, 424, 425, 427, 428, 431, 433 and 442. These runs have examined the effect of zinc oxide thickness in a composite tin oxide/zinc oxide contact layer, in which the amorphous semiconductor is in contact with a layer of zinc oxide preliminarily deposited upon a coating of tin oxide. The zinc oxide films were prepared by rf magnetron sputtering from a zinc oxide target containing 2% wt. $Al_2O_3$, the Al serving to dope the ZnO. The runs have also examined the effect of different surface treatments, for example, argon, hydrogen and/or oxygen plasmas and their durations. The following results have been obtained:

1. An oxygen plasma gives a low series resistance on the order of 4.4 ohm $cm^2$ on zinc oxide or tin oxide/zinc oxide, but appears to increase the series resistance on tin oxide alone to about 6.3 ohm $cm^2$. It is to be noted that the series resistance, defined as dV/dJ at open circuit voltage under 1 sun illumination, should be less than 5.5 ohm $cm^2$ for an acceptable single junction cell and generally lies in the range of from 4.8 to 5.5 ohm $cm^2$. (There are three contributions to the series resistance in a photovoltaic cell, respectively at the transparent conductive oxide/semiconductor interface, at the semiconductor/metallization interface, and the diode resistance. Since the latter two contributions are expected to be constant, variations in series resistance are attributed to variations in contact resistance at the oxide/semiconductor layer. These variations in series resistance directly affect fill factor.) High fill factors (averaging 0.731) were observed in run 424 for oxygen plasma treatment of a composite tin oxide/zinc oxide layer.

2. An argon plasma gave a series resistance of 21.1 ohm $cm^2$ on tin oxide/zinc oxide as compared to 7.0 ohm $cm^2$ on tin oxide alone. The large difference in these values corroborates the values given in Table I from other experiments.

3. Overcoating of tin oxide with sputtered zinc oxide leads to reduction in short circuit current if the coating is excessively thick, that is, if prepared at a scan speed of 1 centimeter/minute. Faster scan speeds on the order of (or greater than) 8 centimeters/minute, where 8 centimeters/minute corresponds to about 1,000 angstrom units, do not appear to seriously reduce the short circuit current.

4. Sputtered zinc oxide alone, without any granular tin oxide undercoating, leads to strong oscillations in quantum efficiency as a function of wavelength (indicating the lack of light trapping) and a reduced short-circuit current density. The lack of light trapping indicates that sputtered zinc oxide films are specular. Granular zinc oxide can be prepared directly by chemical vapor deposition.

5. While a three minute exposure to an oxygen plasma provided 0.842 volts on open circuit, with fill factor of 0.694, a 5 minute exposure to an oxygen plasma achieved 0.820 volts on open circuit, and an increase in fill factor to 0.731.

6. Experimentally, the highest average efficiencies obtained on tin oxide and tin oxide/zinc oxide are so far substantially comparable, as shown in Table II below:

TABLE II

Average Photovoltaic Parameters of Test Cells Distributed Over a Square Foot Substrate for the Best Runs on Tin Oxide/Zinc Oxide (Oxygen-Plasma Treated) and Tin Oxide (Std)'

| TEST | COND COAT | VOLTAGE* | CURRENT** | FILL FTR | EFF |
|---|---|---|---|---|---|
| 428 | Tin Oxide/Zinc Oxide | 0.842 | 14.9 | 0.694 | 8.70% |
| 442 | Tin Oxide | 0.814 | 15.8 | 0.672 | 8.64% |

*Open-circuit voltage in volts
**Short-circuit current density in milliamperes/cm$^2$ The reduced short-circuit current density of the cells on $SnO_2/ZnO$ is attributed to optical absorption in the ZnO, which was 2,000 Å in thickness in this case.

7. There are strong indications that a higher open circuit voltage ($V_{oc}$) can be obtained by overcoating tin oxide with zinc oxide. This is reflected in the data of Table II. Furthermore, if the average $V_{oc}$ for all cells on $SnO_2/ZnO$ is computed, and compared to the average $V_{oc}$ obtained on $SnO_2$ in this series of runs, figures are obtained of 847 mV and 812 mV, respectively. Very high open circuit voltages (870 mV) can be obtained by hydrogen plasma treatment of zinc oxide alone, but this occurs with a reduction in fill factor and a consequent lowering of overall efficiency.

It is anticipated that further refinement of the zinc oxide surface treatment involving an oxidizing plasma will result in cells on tin oxide/zinc oxide having both a high fill factor and open circuit voltage. Values of these parameters will be higher than for cells on tin oxide, and provided the thickness of the zinc oxide is small (about 500 Å), the short-circuit current density of the cells will be equal to that obtained on tin oxide alone. This implies that overcoating of the tin oxide with a thin layer of zinc oxide can be employed to raise the as-deposited cell conversion efficiency.

A further useful and unexpected consequence of the overcoating of tin oxide with zinc oxide for cell fabrication has been the observation of greater photostability of the solar cells when subjected to prolonged illumination. Typical results are shown in Table III where it can be seen that cells matched for initial efficiency and i-layer thickness, but prepared on tin oxide and tin oxide overcoated with zinc oxide, behaved quite differently upon light soaking. In particular, the cell on $SnO_2/ZnO$ suffered a loss of short-circuit current density of only 6 percent compared to 15 percent for the cell on tin oxide alone. The overall loss in efficiency was 22 percent for the cell on the tin oxide/zinc oxide compared to 36 percent for the cell on tin oxide alone, after light soaking in 1 sun for 570 hours, close to the maximum power point.

The reason for this difference is not yet known, but it is speculated that, in the case of deposition onto tin oxide protected by zinc oxide, the absence of free tin (which is always produced by glow discharge deposition of amorphous silicon on tin oxide) may be responsible for the improved stability.

TABLE III

Comparison of photovoltaic parameters before and after light soaking for cells prepared on a standard tin oxide substrate and cells prepared on tin oxide overcoated with zinc oxide.

| SAMPLE SUBSTRATE* | LIGHT SOAKING TIME (hours) | $V_{oc}$ (volts) | $J_{sc}$ (mA/cm$^2$) | FF (%) | Efficiency (%) |
|---|---|---|---|---|---|
| C ($SnO_2$) | 0 | 0.798 | 13.8 | 72.7 | 8.03 |
| | 570 | 0.782 | 11.7 | 55.2 | 5.12 |
| | | (−2%) | (−15%) | (−24%) | (−36%) |
| D ($SnO_2/ZnO$) | 0 | 0.784 | 14.0 | 73.0 | 8.02 |
| | 570 | 0.797 | 13.1 | 59.4 | 6.22 |
| | | (+2%) | (−6%) | (−19%) | (−22%) |

*The i-layer thickness for samples C and D was measured to be 0.37 and 0.36 micrometers (um) respectively.

What is claimed is:

1. In a process for the production of a photoconductive device including a substrate over which there is a conductive layer of zinc oxide and a photoconductive thin film of silicon hydride applied to the surface of the conductive layer, the improvement comprising:
    applying a preliminary conductive layer of tin oxide to the substrate; follow by application of the zinc oxide conductive layer which is then treated with a glow discharge.

2. A process according to claim 1 for making a photovoltaic device comprising:
    depositing said conductive layer of tin oxide on said substrate as a film to form a first current-collecting contact;
    depositing said conductive layer of zinc oxide as film upon said tin oxide to augment said current-collecting contact;
    treating zinc oxide film with a glow discharge in a gas containing oxygen;
    depositing on said zinc oxide film at least one film of silicon containing hydrogen and a conductivity modifying dopant to form a photovoltaic structure; and
    depositing on said photovoltaic structure a conductive film to form a second current-collecting contact.

3. A radiant energy sensitive device, comprising a first radiant energy transmissive, electrically conductive layer of tin oxide;
    a second radiant energy transmissive, electrically conductive layer of zinc oxide disposed upon said layer of tin oxide;

a radiant energy sensitive layer deposited upon said layer of zinc oxide;

whereby the combination of the two radiant energy transmissive, electrically conductive layers improves the performance of said radiant energy sensitive structure with respect to energy passing through said radiant energy transmissive layer.

4. A device as defined in claim 3 wherein said zinc oxide has a surface which is in contact with said radiant energy sensitive layer and is modified.

5. A device as defined in claim 3 wherein said radiant energy sensitive layer is a semiconductor formed from layers of different conductivity types with intrinsic and dopant induced characteristics.

6. A solar cell as defined in claim 3 wherein the combined thickness of said first and second radiant energy transmissive, electrically conducive layers is in the range from 2,000 to about 20,000 angstroms.

7. A device as defined in claim 3 including a radiant energy transmissive substrate for supporting the first radiant energy transmissive, electrically conductive layer.

8. The method of fabricating a radiant energy sensitive device which comprises:
  (a) forming a radiant energy transmissive conductor;
  (b) exposing the radiant energy transmissive conductor to a hydrogen containing plasma to modify the surface thereof; and
  (c) depositing an energy sensitive structure upon the modified surface of said energy transmissive conductor whereby the modification of said energy transmissive conductor improves the response of said energy sensitive structure to energy entering therein.

9. The method of claim 8 wherein said radiant energy transmissive conductor is a laminate comprising zinc oxide.

10. The method of claim 8 wherein said radiant energy transmissive conductor is a laminate of zinc oxide and tin oxide.

* * * * *